United States Patent [19]

Lesk et al.

[11] Patent Number: 4,832,996

[45] Date of Patent: May 23, 1989

[54] SEMICONDUCTOR DIE FOR PLASTIC ENCAPSULATION HAVING AN ADHESION PROMOTER

[75] Inventors: Israel A. Lesk, Phoenix; Ronald E. Thomas, Tempe; George W. Hawkins, Mesa, all of Ariz.

[73] Assignee: Motorola, Inc., Schaumberg, Ill.

[21] Appl. No.: 159,975

[22] Filed: Feb. 24, 1988

[51] Int. Cl.$^4$ .............................................. B32B 1/04
[52] U.S. Cl. ........................................ 428/76; 428/68;
428/201; 428/209; 428/210; 428/192; 428/426;
428/433; 428/435; 428/417; 428/473.5;
428/458; 428/415; 428/416; 428/901; 174/52.4
[58] Field of Search .................... 174/52 FP; 357/71;
427/96; 428/209, 210, 500, 426, 515, 501, 473.5,
460, 461, 901, 68, 76, 201, 192, 438, 435, 417,
458, 415, 416

[56] References Cited

U.S. PATENT DOCUMENTS

| 4,097,889 | 6/1978 | Kern et al. | 437/12 |
| 4,518,631 | 5/1985 | Antonen | 523/435 |
| 4,632,798 | 12/1986 | Eickman et al. | 528/183 |
| 4,719,250 | 1/1988 | Eickman et al. | 524/599 |
| 4,720,424 | 1/1988 | Eickman et al. | 428/480 |
| 4,721,994 | 1/1988 | Mine et al. | 428/450 |

Primary Examiner—Ellis P. Robinson
Assistant Examiner—P. J. Ryan
Attorney, Agent, or Firm—Harry Wolin

[57] ABSTRACT

A semiconductor die for plastic encapsulation having an adhesion promoter selectively disposed on an outer surface enabling better adhesion between the semiconductor die and a plastic encapsulation. The improved adhesion allows for less relative motion between the semiconductor die and the plastic encapsulation. The reduction of relative motion significantly decreases the delamination progression throughout the semiconductor device and allows for an increased semiconductor device lifetime.

17 Claims, 1 Drawing Sheet

U.S. Patent     May 23, 1989     4,832,996
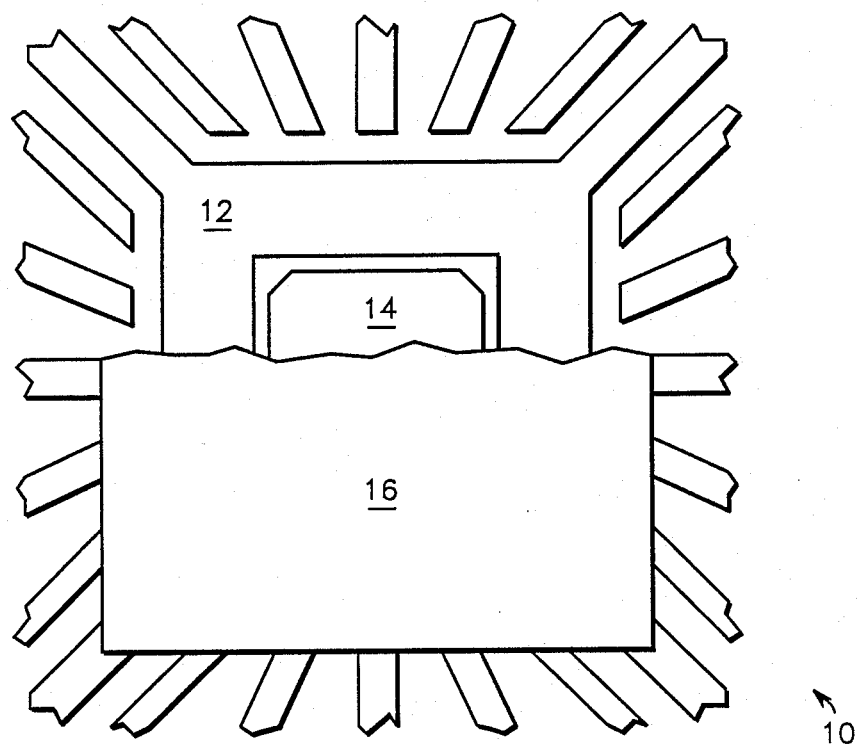
FIG. 1
FIG. 2
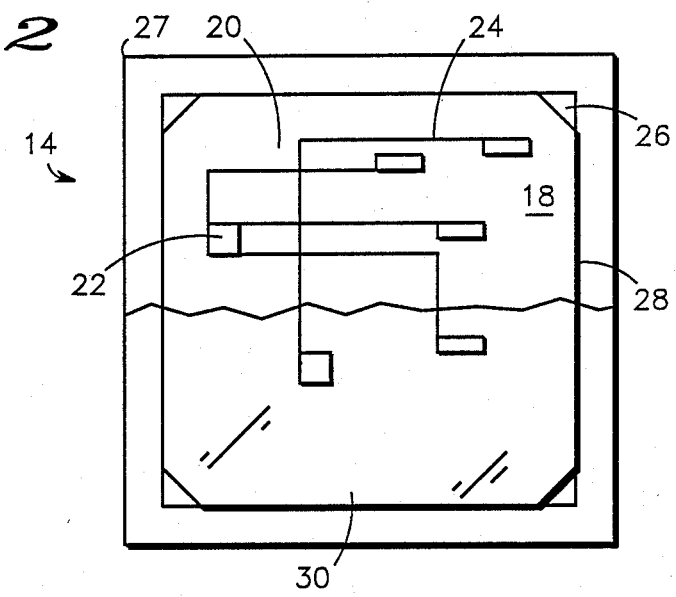

SEMICONDUCTOR DIE FOR PLASTIC ENCAPSULATION HAVING AN ADHESION PROMOTER

BACKGROUND OF THE INVENTION

This invention relates, in general, to semiconductor devices, and more particularly to a semiconductor die for plastic encapsulation which includes an adhesion promoter.

A semiconductor device in which this invention will typically be used includes a silicon semiconductor die having metal interconnect lines which are covered by passivation glass. The die is mounted on the flag of a leadframe and the die and flag are then encapsulated in plastic at a high temperature. The expansion coefficient of the plastic encapsulant is much larger than that of the silicon die and, therefore, the plastic encapsulant cannot fully contract as it cools. In large packages, deleterious results of this thermal expansion mismatch are especially evident during temperature cycling tests where the temperature extremes often range between −65 and 150 degrees centigrade.

When the plastic encapsulant contracts, large magnitudes of stress act on the silicon semiconductor die. The stress is highest at the edges and corners of the die. The stress causes the plastic encapsulation to crack adjacent to the corner of the semiconductor die. This allows for relative motion between the plastic encapsulant and the semiconductor die which causes the passivation glass of the semiconductor die to crack and break, further causing delamination, especially at the high stress corners. It is common for this delamination to travel through the metal interconnect lines and shear them into separate plates. This results in a semiconductor device having a decreased lifetime.

Prior attempts at solving the delamination problem have included voiding the die corners of the semiconductor die of circuitry, interconnects and wire bonds. Although this does not stop the delamination, it increases the lifetime of the semiconductor device because the operational circuitry is further away from the corner regions and is not affected by the initial delamination. The present invention improves adhesion between the semiconductor die and the plastic encapsulation thereby reducing the relative motion between the plastic encapsulant and the semiconductor die to prohibit delamination and increase semiconductor device lifetime.

SUMMARY OF THE INVENTION

Accordingly, it an object of the present invention to provide a semiconductor die for plastic encapsulation which will result in an increased semiconductor device lifetime.

Another object of this invention is to provide a semiconductor die for plastic encapsulation having improved adhesion between the semiconductor die and the plastic encapsulation.

It is an additional object of the present invention to provide a semiconductor die for plastic encapsulation that reduces the delamination of the passivation glass and the metal system of the semiconductor die.

The foregoing and other objects and advantages are achieved in the present invention by the selective application of an adhesion promoter to the outer surface of a semiconductor die. The adhesion promoter adheres the semiconductor die to the plastic encapsulation and reduces the amount of relative motion caused by cracks in the plastic encapsulation. The reduced amount of relative motion between the semiconductor die and the plastic encapsulation reduces the inherent delamination problem.

A more complete understanding of the present invention can be attained by considering the following detailed description in conjunction with the accompanying drawings.

BRIEF DESCRIPTION OF THE DRAWINGS

FIG. 1 is a highly enlarged top view of a plastic encapsulated semiconductor device having a portion of the plastic encapsulation cut away; and FIG. 2 is a highly enlarged top view of the semiconductor die which is included in the device of FIG. 1.

DETAILED DESCRIPTION OF THE DRAWINGS

FIG. 1 is a highly enlarged top view of a plastic encapsulated semiconductor device of the type in which the present invention will be used. The device includes a leadframe 10 having a flag 12. A semiconductor die 14 is mounted on flag 12 of leadframe 10. A portion of leadframe 10 which includes flag 12 is encapsulated in a plastic encapsulation 16 which has been partially cut away in this figure.

FIG. 2 shows a highly enlarged top view of an outer surface 18 of semiconductor die 14. Semiconductor die 14 includes an operational circuitry area 20 which contains all the operational circuitry of semiconductor die 14. The operational circuitry includes a plurality of bond pads 22 and interconnect lines 24. Both bond pads 22 and interconnect lines 24 are comprised of metal. One skilled in the art will recognize that many well known metals may be employed. Outer metallization lines 28 reside in certain peripheral regions of semiconductor die 14. Outer metallization lines 28 isolate operational circuitry area 20 from the remainder of semiconductor die 14. Semiconductor die 1 further includes circuit area corners 26 which are void of any operational circuitry and die corners 27. Circuit area corners 26 provide longer device lifetime by being void of operational circuitry because delamination there does not effect the operational circuitry of semiconductor die 14.

Operational circuitry area 20 is covered by a passivation glass 30 which is partially removed in this figure. In this embodiment, passivation glass 30 is silicon dioxide which is doped with phosphorous. Passivation glass 30 keeps moisture and impurities away from operational circuitry area 20 with the exception of bond pads 2 which remain uncovered. This reduces corrosion and increases device lifetime.

A frequent problem in semiconductor devices of this type is that plastic encapsulation 16 delaminates from semiconductor die 14. It is common that certain interconnect lines 24 residing in the peripheral regions of operational circuitry area 20 are destroyed as a result of this delamination. The delamination results because the expansion coefficients of plastic encapsulation 16 and semiconductor die 14, which is commonly made of silicon, differ. Therefore, when plastic encapsulation 16 contracts during cooling, it cracks adjacent to die corners 27 of semiconductor die 14. This crack allows for relative motion between plastic encapsulation 16 and semiconductor die 14. In turn, this relative motion causes delamination to occur.

Relative motion between semiconductor die 14 and plastic encapsulation 16 is decreased by selectively adhering semiconductor die 44 to plastic encapsulation 16. Because the relative motion is reduced, the delamination does not occur or is substantially impeded. The stress caused by the differing expansion coefficients may be relieved by crack propagation through the bulk of plastic encapsulation 16 in the region below semiconductor die 14. This increases semiconductor device lifetime because failure of the device is not related to the breakup of the passivation glass-metal system, but rather to cracking of plastic encapsulation 16 to an outer package surface. One skilled in the art will understand that although cracking of plastic encapsulation 16 is not desired, it is a preferred alternative to passivation glass-metal system breakup.

In one embodiment of the present invention, passivation glass 30 is not disposed on circuit area corners 26 of semiconductor die 14. An adhesion promoter is then selectively disposed on circuit area corners 26. In a preferred embodiment, circuit area corners 26 have an aluminum surface which is chemically treated with an adhesion promoter Such an embodiment would require only one mask change in the process sequence and a chemical treatment of circuit area corners 26. One skilled in the art will understand that many chemical treatments may promote adhesion.

Another embodiment of the present invention includes selectively disposing an adhesion promoter on passivation glass 30 in the areas where it covers circuit area corners 26. The layer of adhesion promoter may also extend to cover outer metallization lines 28 or the entire first surface 18 of semiconductor die 14. An adhesion promoter such as polyimide or epoxy which adheres well to both plastic encapsulation 16 and passivation glass 30 is used. The application of the adhesion promoter is done in wafer form. This requires an additional masking step in the process sequence as well as leaving bond pads 22 uncovered (which is current practice with glass passivation).

A further embodiment of the present invention would include entirely coating outer surface 18 of semiconductor die 14 with a hard organic adhesion promoter such as polyimide or epoxy. This is done following wire bonding. In this embodiment, the coating is only partially cured prior to encapsulating the device in plastic in order to promote adhesion between plastic encapsulation 16 and semiconductor die 14 via chemical bonding between the adhesion promoter and plastic encapsulation 16. It should be understood the adhesion promoter will become completely cured during the encapsulation process.

Thus it is apparent that there has been provided, in accordance with the invention, an improved semiconductor device and die which meet the objects and advantages set forth above. While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

We claim:

1. A semiconductor die for plastic encapsulated semiconductor devices comprising:
    an outer surface;
    an operational circuitry area on said outer surface;
    outer metallization lines at least partially surrounding said operational circuitry area;
    a plurality of die corners and circuit area corners on said outer surface, said die corners and circuit area corners being void of circuitry;
    protective coating means comprising a passivation glass dispersed on said outer surface; and
    mean selected from polyimide or epoxy for adhering said semiconductor die to a plastic encapsulation.

2. The semiconductor die of claim 1, wherein the passivation glass does not cover the circuit area corners and the means for adhering is selectively disposed only in said circuit area corners.

3. The semiconductor die of claim 1, wherein the means for adhering is selectively disposed on the passivation glass only in said circuit area corners.

4. The semiconductor die of claim 3 wherein the means for adhering is further selectively disposed on the outer metallization lines.

5. The semiconductor die of claim 4 wherein the means for adhering is disposed on the entire outer surface of said semiconductor die.

6. The semiconductor die of claim 5 wherein the means for adhering is only partially cured prior to the plastic encapsulation of said semiconductor die.

7. A semiconductor die for plastic encapsulated semiconductor devices comprising:
    an outer surface;
    an operational circuitry area on said outer surface;
    a plurality of outer metallization lines at least partially surrounding said operational circuitry area;
    a plurality of die corners and circuit area corners on said outer surface, said die corners and circuit area corners being void of circuitry;
    passivation glass on said outer surface; and
    an adhesion promoter comprising polyimide or epoxy selectively disposed on said passivation glass covering said outer surface, said adhesion promoter for adhering said semiconductor die to a plastic encapsulation.

8. The semiconductor die of claim 7 wherein the passivation glass does not cover the circuit area corners and the adhesion promoter is selectively disposed only in said circuit area corners.

9. The semiconductor die of claim 7 wherein the adhesion promoter is selectively disposed on the passivation glass only in said circuit area corners.

10. The semiconductor die of claim 9 wherein the adhesion promoter is further disposed on the outer metallization lines.

11. The semiconductor die of claim 10 wherein the adhesion promoter is disposed on the entire outer surface of said semiconductor die.

12. The semiconductor die of claim 11 wherein the adhesion promoter is only partially cured prior to the plastic encapsulation of said semiconductor die.

13. The semiconductor die of claim 11 wherein the adhesion promoter is applied while said semiconductor die is in wafer form.

14. A plastic encapsulated semiconductor device comprising:
    a semiconductor die having an outer surface and a plurality of die corners and circuit area corners which are void of circuitry.
    an adhesion promoter selected from polyimide or epoxy selectively disposed and covering at least said circuit area corners of said semiconductor die; and a plastic material encapsulating said semiconductor die and having enhanced adhesion to said semiconductor die.

15. The semiconductor device of claim 14 wherein the outer surface of the semiconductor die is covered with passivation glass and the adhesion promoter is disposed on said passivation glass.

16. The semiconductor device of claim 15 wherein the adhesion promoter is disposed on the entire outer surface of the semiconductor die.

17. The semiconductor device of claim 16 wherein the adhesion promoter is only partially cured prior to the plastic encapsulation of the semiconductor die.

* * * * *